United States Patent [19]

Glennon

[11] Patent Number: 4,520,279

[45] Date of Patent: May 28, 1985

[54] SERIES TRANSISTOR CHOPPER

[75] Inventor: Timothy F. Glennon, Rockford, Ill.

[73] Assignee: Sundstrand Corporation, Rockford, Ill.

[21] Appl. No.: 549,280

[22] Filed: Nov. 7, 1983

[51] Int. Cl.³ .......................................... H03K 17/60
[52] U.S. Cl. ................................. 307/254; 318/75;
318/345 F; 318/519
[58] Field of Search ............... 318/75, 139, 345 F,
318/345 B, 439, 346, 519; 307/254, 240;
363/124

[56] References Cited

U.S. PATENT DOCUMENTS

| | | | |
|---|---|---|---|
| 2,835,829 | 5/1958 | Sourgens et al. | 307/254 X |
| 3,095,510 | 6/1963 | Lane | 307/254 X |
| 3,184,638 | 5/1965 | Wood | 307/254 X |
| 3,305,722 | 2/1967 | Mitchell . | |
| 3,800,166 | 3/1974 | Keiner . | |
| 4,017,777 | 4/1977 | Bailey . | |
| 4,211,961 | 7/1980 | Marumoto et al. | 318/139 |
| 4,257,092 | 3/1981 | Prines et al. . | |
| 4,291,259 | 9/1981 | Marumoto et al. | 318/139 |
| 4,359,650 | 11/1982 | Newcomb | 307/254 X |
| 4,360,744 | 11/1982 | Taylor | 307/254 |
| 4,367,421 | 1/1983 | Baker | 307/254 X |
| 4,406,982 | 9/1983 | McClellan | 318/139 X |
| 4,410,810 | 10/1983 | Christen | 307/254 X |

FOREIGN PATENT DOCUMENTS

| | | | |
|---|---|---|---|
| 1131319 | 9/1982 | Canada | 318/139 |
| 40721 | 3/1977 | Japan | 318/345 F |
| 153215 | 12/1979 | Japan | 318/345 F |
| 0935331 | 6/1982 | U.S.S.R. | 318/139 |

OTHER PUBLICATIONS

Schaum's Outline Series "Electronics Technology" pp. 103-104, McGraw-Hill, 1982.
ibid. pp. 113-115.

Primary Examiner—Vit W. Miska
Assistant Examiner—Bentsu Ro
Attorney, Agent, or Firm—Wood, Dalton, Phillips, Mason, & Rowe

[57] ABSTRACT

A transistor chopper for controlling the power delivered to a DC load from a DC source includes two or more transistors connected in series between the DC source and the load and means for controlling the voltage across each transistor so that the transistor is subjected to only a fraction of the open circuit voltage developed by the DC source. Lower power transistors may therefore be used as switching elements in the chopper, and hence the overall cost of the system is reduced over prior choppers.

8 Claims, 3 Drawing Figures

U.S. Patent  May 28, 1985  4,520,279
FIG. 1 PRIOR ART
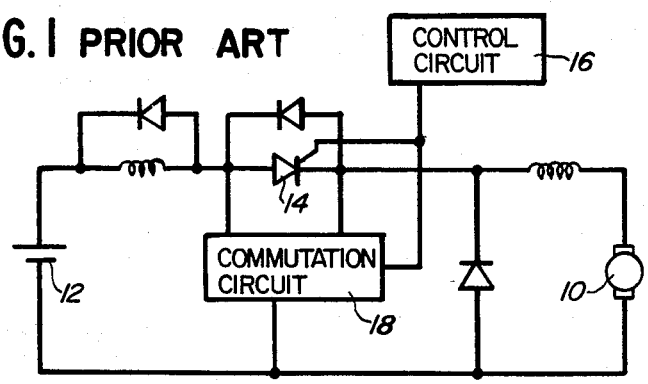
FIG. 2
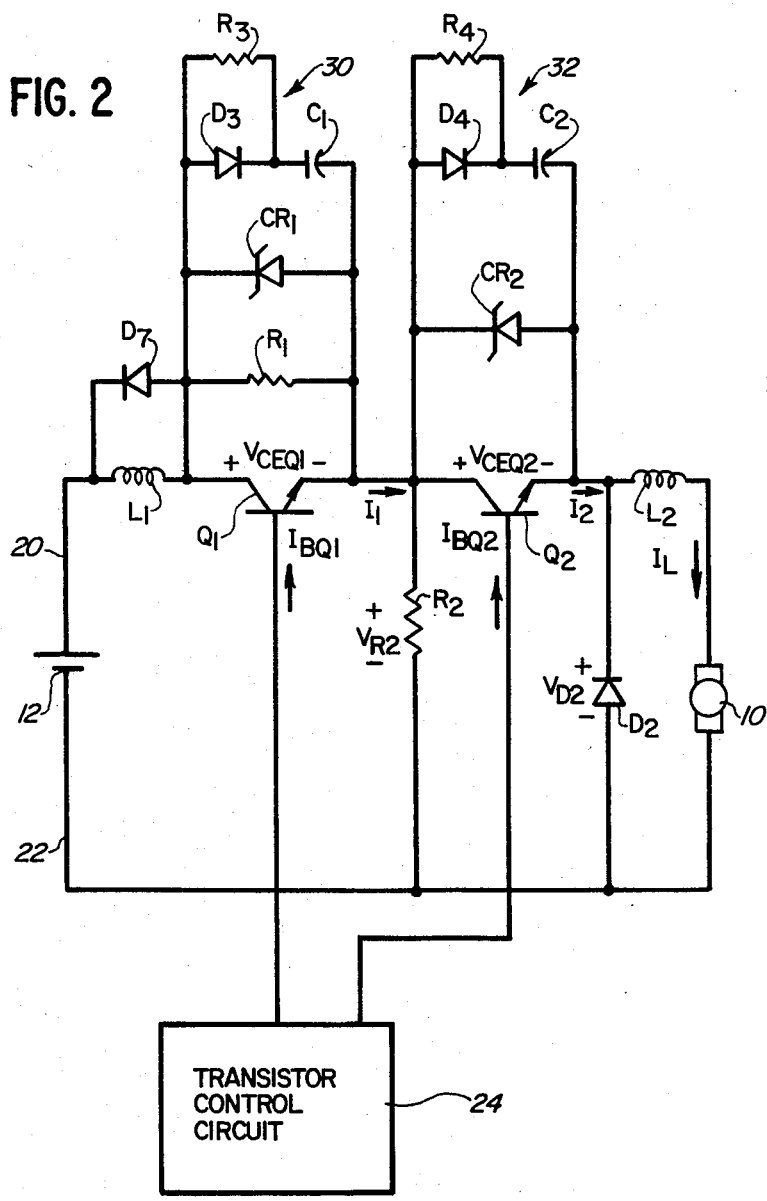
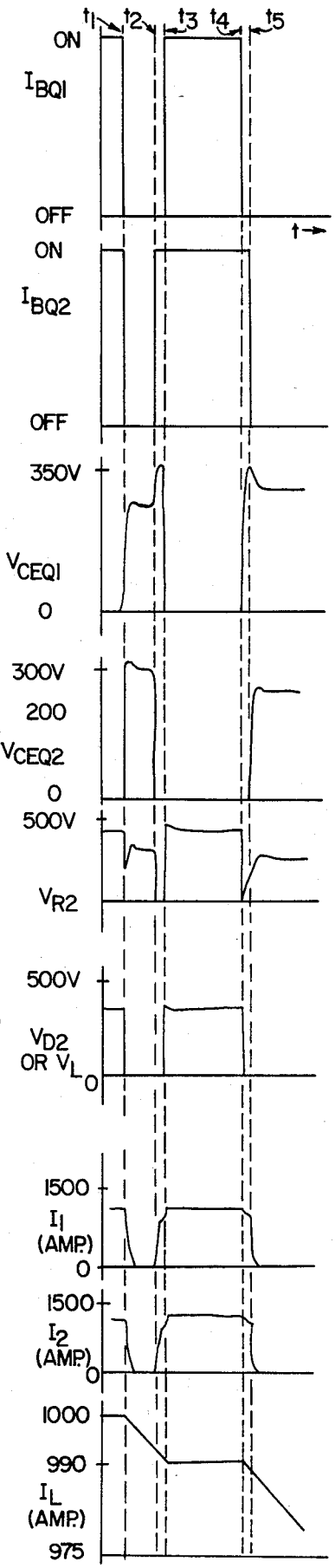
FIG. 3

SERIES TRANSISTOR CHOPPER

BACKGROUND OF THE INVENTION

The present invention relates generally to power supply apparatus and more particularly to a chopper circuit for controlling the amount of power delivered to a DC load from a DC source.

Chopper circuits are typically utilized to control the speed of a DC motor by controlling the power delivered thereto from a DC source, such as a battery. Prior chopper circuits have utilized a silicon controlled rectifier, or SCR, connected in series between the DC source and the motor. The SCR is gated into conduction by control pulses which are generated as a function of the commanded speed of the motor.

While such a system is effective to control the speed of the motor, such a system requires bulky and expensive commutation circuits to insure that the SCR is commutated off at appropriate times to accurately control the power delivered to the motor.

Another chopper known in the prior art is disclosed in Marumoto et al U.S. Pat. No. 4,211,961. This chopper utilizes a plurality of parallel-connected transistors coupled in series between a DC source and a motor. Each transistor is gated into conduction at appropriate times to control the power delivered to the motor.

While the Marumoto et al system eliminates the need for the bulky and expensive commutation circuitry noted above, it has been found that this system can be utilized only in low to medium power applications where the voltage developed by the DC source does not exceed the maximum rated voltage of the transistors. At the present time, commercially available power transistors have voltage ratings on the order of 450 volts. This system cannot, therefore, be utilized to control the speed of relatively large DC loads energized by high voltage sources of potential.

SUMMARY OF THE INVENTION

In accordance with the present invention, a transistor chopper for controlling the power delivered to a DC load from a DC source includes two or more transistors connected in series between the DC source and the load and means for controlling the voltage across each transistor so that the transistor is subjected to only a fraction of the voltage developed by the DC source at any time.

The chopper includes n transistors connected in series bewteen the source and the load, where n may be any number greater than or equal to two. Base drive circuitry is coupled to the transistors for developing base drive signals to switch the transistors between on and off states to control the power delivered to the load. Means are connected to each transistor for providing a path for DC current during the time that all transistors are off such that a portion of the DC voltage developed by the source appears across each transistor. When the base drive circuitry instructs all of the transistors to turn off or turn on, it may happen that one or more of the transistors will conduct before the remaining transistors are gated on. In such a case, separate voltage control means associated with each transistor controls the voltage across each transistor to prevent a condition in which the full DC voltage is impressed across one of the transistors.

Each voltage control mens includes a zener diode for clamping the collector-to-emitter voltage of the associated transistor at a particular value of the open circuit battery voltage. The voltage control means further includes snubbers for controlling the rate of change of voltage with respect to time at a certain level.

BRIEF DESCRIPTION OF THE DRAWINGS

FIG. 1 is a schematic diagram of a prior art SCR chopper circuit;

FIG. 2 is a schematic diagram of the series transistor chopper of the present invention; and FIG. 3 is a set of waveform diagrams illustrating the operation of the circuit shown in FIG. 2.

DESCRIPTION OF THE PREFERRED EMBODIMENT

Referring now to FIG. 1, there is illustrated a prior type of chopper circuit for controlling the power delivered to a load, such as a motor 10, such power being developed by a DC source illustrated generally at 12. The power developed by the DC source is modulated by a thyristor in the form of a silicon controlled rectifier or SCR 14 coupled in series between the DC source 12 and the motor 10. The firing of the SCR 14 is accomplished by means of a control circuit 16 which develops appropriate gating signals for the SCR 14 in response to a commanded speed for the motor 10 and/or feedback signals which sense operating parameters of the motor 10.

Due to the nature of silicon controlled rectifiers, the circuitry shown in FIG. 1 requires a commutation circuit 18 which is coupled to the control circuit 16 and across the anode and cathode of the SCR 14 to quickly turn off the SCR 14 when commanded by the control circuit 16. The commutation circuit 18 contains bulky and expensive components which add to the weight and cost of the chopper.

In order to eliminate the necessity for the commutation circuit shown in FIG. 1, the chopper circuit of the present invention, shown in FIG. 2, utilizes switching transistors connected in series between the DC source and a load such as the motor 10. The circuit shown in FIG. 2 is particularly advantageous in applications where it is desired to operate a large DC motor requiring modulation or "chopping" of a high-level DC voltage provided by a DC source 12. The present invention allows the use of relatively inexpensive transistors having a voltage rating less than the open circuit voltage of the DC source 12 to modulate the flow of power to the motor 10.

The circuit shown in FIG. 2 includes n transistors serially connected between the voltage source 12 and the motor 10. The circuit of FIG. 2 is described for the condition n=2, it being understood that n may be any number greater than 2.

The battery 12 generates first and second DC voltages at terminals which are coupled to the chopper over first and second DC conductors 20,22. The first conductor 20 may be directly connected to the collector of the transistor Q1 or may be connected thereto through an inductor or choke coil L1 which controls the rate of change of current into the chopper. Connected across the inductor L1 is a diode D7 which dissipates the back EMF developed by the inductor L1.

The emitter of the transistor Q1 is connected to the collector of the transistor Q2 and the emitter of Q2 is connected through an inductor L2 to the DC motor 10. The inductor L2 controls the rate of change of current through the motor 10 in conjunction with a diode D2 connected between the second conductor 22 and the junction between the transistor Q2 and the inductor L2.

A first resistor R1 is connected across the collector-emitter circuit of the transistor Q1 and a second resistor R2 is connected between the second conductor 22 and the junction between the transistors Q1 and Q2. In the preferred embodiment, the values of the resistors R1 and R2 are equal, although this need not be the case. The first and second resistors R1 and R2 establish a current path for the DC current developed by the DC source 12 when the transistors Q1 and Q2 are both off.

The transistors Q1 and Q2 include base electrodes which are connected to transistor control circuitry 24. The control circuitry 24 develops base drive signals to switch the transistors between on and off states to thereby control the power delivered to the load 10. The outputs from the control circuit 24 are transmitted simultaneously to the bases of transistors Q1 and Q2.

Even though both transistors Q1 and Q2 simultaneously receive the base drive signals, the transistors may have differing characteristics causing one to turn on or turn off before the other. In such a case, the transistor which is in the off state may be subjected to the entire DC source voltage. In order to prevent this condition from occurring, first and second zener diodes CR1 and CR2 are connected across the collector-emitter circuits of the first and second transistors Q1 and Q2, respectively. The zener diodes have a high power rating to effectively clamp the collector to emitter voltage of the transistors at a particular percentage of the source voltage and must be capable of conducting full motor current for a short amount of time. In the preferred embodiment, the zener diodes CR1 and CR2 are power zeners which clamp the collector to emitter voltage for each transistor at approximately 60% of the open circuit DC source voltage. The devices are rated to conduct full motor current for three or four microseconds.

When the transistor control circuit 24 develops a signal to turn off the transistors Q1 and Q2, one of the transistors may switch to the off state while the other remains in the on state.

Connected across each collector-emitter circuit is a snubber circuit 30,32 which limits the rate of change of voltage across the off transistor during this time until the clamping voltage for the zener diode connected in parallel therewith is reached. The snubber circuit 30 connected across the transistor Q1 includes an RC circuit, comprising a resistor R3 and a capacitor C1, with a diode D3 connected across the resistor R3. Likewise, the snubber circuit 32 for the transistor Q2 consists of an RC circuit including a resistor R4 in series with a capacitor C2 with the combination connected across the collector-emitter circuit of the transistor Q2. A diode D4 is connected across the resistor R4.

Referring also to FIG. 3, the operation of the circuit shown in FIG. 2 is described in conjunction with the waveforms illustrated therein. The waveforms of FIG. 3 were generated by computer simulation utilizing the component values listed below.

| | |
|---|---|
| OPEN CIRCUIT VOLTAGE OF SOURCE 12 | 600 V |
| INTERNAL RESISTANCE OF SOURCE 12 | .2Ω |
| L1 | 100 nh |
| R1 | 300Ω |
| R2 | 300Ω |
| R3 | 5Ω |
| R4 | 5Ω |
| C1 | 2 μf |
| C2 | 2 μf |
| COMBINED INDUCTANCE OF L2 AND MOTOR 10 | 500 μh |
| RESISTANCE OF MOTOR 10 | .4Ω |
| BREAKDOWN VOLTAGE OF CR1 AND CR2 | 350 V |

At the start of computer simulation, time t=0, it is assumed that both transistors Q1 and Q2 are in the on state and that a load current $I_L$ of 1000 amperes flows through the motor 10. During this time, a negligible voltage drop appears across each of the transistors Q1 and Q2, and hence a voltage $V_{R2}$ across the resistor R2 and a voltage $V_{D2}$ across the diode D2 and the series connection of the inductor L2 and motor 10 are both approximately equal to the open circuit voltage of 600 volts minus the drop across the internal resistance of the source 12 and the drop across the inductor L1.

At time $t_1$, both transistors Q1 and Q2 switch from the on state to the off state. At this time, the voltage across the collector-emitter circuit of each transistor rises to approximately one-half of the open circuit voltage of the source 12, or 300 volts. Also, at this time the voltage $V_{D2}$ across the diode D2 and the inductor L2 and motor 10 drops to approximately −1 volt. Load current $I_L$ begins to decrease during this interval from the initial value of 1000 amps until both transistors Q1 and Q2 are subsequently turned back on again.

At time $t_2$, the transistor Q2 is turned on as illustrated by the waveform $I_{BQ2}$, while at a time $t_3$ subsequent to $t_2$, the transistor Q1 is turned on as illustrated by a waveform $I_{BQ1}$. Between times $t_2$ and $t_3$, the voltage $V_{CEQ1}$ across the collector-emitter circuit of the transistor Q1 rises to the zener breakdown voltage of approximately 350 volts. The voltage is clamped at this value until the time $t_3$, at which point the voltage $V_{CEQ1}$ drops to approximately two volts.

Also, between times $t_2$ and $t_3$, two branch currents $I_1$ and $I_2$ increase exponentially. The branch current $I_1$ is equal to the current from the emitter of Q1 plus the current through the associated snubber circuit, zener diode and resistance R1. The current $I_2$ is equal to $I_1$ minus the current through the resistor R2.

Beginning at time $t_3$, the voltage across the resistor R2 and the voltage across the diode D2 increase sharply.

Subsequent to time $t_3$, the current through the load $I_L$ increases exponentially a slight amount; however, the scale of the waveforms in FIG. 3 causes the load current to appear to be constant during this interval.

Between times $t_3$ and $t_4$, both transistors Q1 and Q2 are fully conducting and hence the voltage across each is approximately two volts. The currents $I_2$ and $I_2$ increase slightly while the voltages $V_{R2}$ and $V_{D2}$ decay slightly.

At time $t_4$, transistor Q1 is abruptly turned off. The voltage $V_{CEQ1}$ across this transistor rises to the 350 volt clamping level provided by the diode CR1 while the voltage across the transistor Q2 remains at approximately two volts. The rate of rise of voltage across the transistor Q1 is controlled by the snubber circuit 30, as previously noted. Also, subsequent to time $t_4$, the voltage across the resistor R2 begins to rise and the voltage across the diode D2 clamps at approximately −1 volt. The currents $I_1$ and $I_2$ and the load current $I_L$ decreases due to the de-energization of the transistor Q1.

At time $t_5$, the transistor Q2 is also turned off. The voltage across the collector-emitter circuit of the transistor Q1 therefore decreases while the voltage across the collector-emitter circuit of the transistor Q2 and the voltage across the resistor R2 increases. At this time, the branch currents $I_1$ and $I_2$ decay to zero and the load current continues to decay until the transistors Q1 and Q2 are subsequently turned back on.

In the event that the transistor Q1 is turned on while the transistor Q2 is off, the voltage across the transistor Q2 is controlled by the zener diode CR2 to prevent application of the full DC source voltage thereto, as described above in connection with the zener diode CR1. Also, the rate of change of voltage across Q2 is controlled by the snubber circuit 32, similar to the operation of the snubber circuit 30 described above.

It can be seen from the waveform diagrams of FIG. 3 that the voltage across each of the transistors Q1 and Q2 does not exceed the breakdown voltage of the zener diode CR1 or CR2, and hence these transistors may have a voltage rating less than the open circuit voltage of the DC source 12. Accordingly, relatively large motors can be controlled utilizing this circuit. Furthermore, in the event that smaller motors are to be controlled by this circuit, less expensive components can be utilized to reliably control the motor.

I claim:

1. A transistor chopper circuit for controlling the power delivered to a DC motor from a battery developing a voltage and current and having first and second terminals connected to first and second conductors, respectively, comprising:

first and second transistors each having collector and emitter electrodes, the transistors being connected in series between the battery and the motor, the first transistor being coupled to the first conductor and the second transistor being coupled to the motor, the transistors having turn-on and turn-off times which may differ from one another;

a transistor control connected to the transistors for developing a signal to switch all of the transistors between on and off states to control the power delivered to the motor;

a first resistor connected across the collector and emitter electrodes of the first transistor;

a second resistor connected between the second conductor and the junction between the first and second transistors, the first and second resistors providing a path for the DC current when the transistors are off; and means connected across the collector and emitter electrodes of the transistors for controlling the voltage across one of the transistors when the difference in turn-on and turn-off times results in the one transistor being in the off state while the other transistor is in the on state.

2. A transistor chopper circuit for controlling the power delivered to a DC motor from a battery developing a voltage and current and having first and second terminals connected to first and second conductors, respectively, comprising:

first and second transistors each having a collector and emitter electrodes, the transistors being connected in series between the battery and the motor, the first transistor being coupled to the first conductor and the second transistor being coupled to the motor;

a transistor control connected to the transistors for switching the transistors between on and off states to control the power delivered to the motor;

a first resistor connected across the collector and emitter electrodes of the first transistor;

a second resistor connected between the second conductor and the junction between the first and second transistors, the first and second resistors providing a path for the DC current when the transistors are off; and means connected across the collector and emitter electrodes of the transistors for controlling the voltage across one of the transistors when that transistor is in the off state and the other transistor is in the on state, wherein the controlling means includes first and second zener diodes connected across the collector and emitter electrodes of the first and second transistors, respectively.

3. In a circuit for controlling the power delivered to a load from a power source which develops voltage and current, the improvement comprising:

n transistors connected in series between the source and the load, each having a rated voltage less than the voltage of the power source where $n > 1$;

means coupled to each of the transistors for developing a signal to switch all of the transistors between on and off states to control the power delivered to the load;

means coupled to the transistors for conducting the power source current when all the transistors are off such that a portion of the power source voltage appears across each transistor; and means coupled to the transistors for controlling the voltage across each transistors so that the voltage across each transistor is maintained below the voltage rating thereof, wherein the voltage controlling means includes means for limiting the rate of change of voltage across each transistor as the transistors are switched between the on and off states.

4. In a chopper circuit for controlling the power delivered to a DC load from a DC source generating DC voltage and current, the improvement comprising:

n transistors connected in series between the source and the load, each having a rated voltage less than the voltage of the DC source where $N > 1$, each transistor including a collector and emitter electrode;

means coupled to the transistors for developing signals to switch the transistors between on and off states to control the power delivered to the load;

means coupled to the transistors for conducting the DC current when all the transistors are off such that a portion of the DC voltage appears across each transistor; and means coupled to the transistors for controlling the voltage across each transistor in the off state when at least one of the transistors is in the on state so that that voltage across each off transistor is less than the voltage rating thereof, including means for limiting the rate of change of voltage across each transistor in the off state, the limiting means including an RC circuit connected across the collector and emitter electrodes of each transistor.

5. The improvement of claim 4, wherein the RC circuit comprises a capacitor in series with a resistor and wherein the limiting means further includes a diode connected in parallel with the resistor.

6. A transistor chopper circuit for controlling the power delivered to a DC motor from a battery developing a voltage and current and having first and second terminals connected to first and second conductors, respectively, comprising:

first and second transistors each having collector and emitter electrodes, the transistors being connected in series between the battery and the motor, the first transistor being coupled to the first conductor and the second transistor being coupled to the motor;

a transistor control connected to the transistors for switching the transistors between on and off states to control the power delivered to the motor;

a first resistor connected across the collector and emitter electrodes of the first transistor;

a second resistor connected between the second conductor and the junction between the first and second transistors, the first and second resistors providing a path for the DC current when the transistors are off; and means connected across the collector and emitter electrodes of the transistors for controlling the voltage across one of the transistors when that transistor is in the off state and the other transistor is in the on state, wherein the controlling means includes means for limiting the rate of change of voltage across each transistor when such transistor is in the off state.

7. A transistor chopper circuit for controlling the power delivered to a DC motor from a battery developing a voltage and current and having first and second terminals connected to first and second conductors, respectively, comprising:

first and second transistors each having collector and emitter electrodes, the transistors being connected in series between the battery and the motor, the first transistor being coupled to the first conductor and the second transistor being coupled to the motor;

a transistor control connected to the transistors for switching the transistors between on and off states to control the power delivered to the motor;

a first resistor connected across the collector and emitter electrodes of the first transistor;

a second resistor connected between the second conductor and the junction between the first and second transistors, the first and second transistors providing a path for the DC current when the transistors are off; and means connected across the collector and emitter electrodes of the transistors for controlling the voltage across one of the transistors when that transistor is in the off state and the other transistor is in the on state including means for limiting the rate of change of voltage across each transistor when such transistor is in the off state, the limiting means further including first and second RC circuits connected across the collector and emitter electrodes of the first and second transistors, respectively.

8. A transistor chopper circuit for controlling the power delivered to a DC motor from a battery developing a voltage and current and having first and second terminals connected to first and second conductors, respectively, comprising:

first and second transistors each having collector and emitter electrodes, the transistors being connected in series between the battery and the motor, the first transistor being coupled to the first conductor and the second transistor being coupled to the motor;

a transistor control connected to the transistors for switching the transistors between on and off states to control the power delivered to the motor;

a first resistor connected across the collector and emitter electrodes of the first transistor;

a second resistor connected between the second conductor and the junction between the first and second transistors, the first and second resistors providing a path for the DC current when the transistors are off; and means connected across the collector and emitter electrodes of the transistors for controlling the voltage across one of the transistors when that transistor is in the off state and the other transistor is in the on state including means for limiting the rate of change of voltage across each transistor when such transistor is in the off state, the limiting means including a charging resistor and a capacitor connected in series across the collector and emitter electrodes of each transistor and a diode connected in parallel with the charging resistor.

* * * * *